United States Patent
Bair et al.

(10) Patent No.: US 9,892,010 B2
(45) Date of Patent: Feb. 13, 2018

(54) PERSISTENT COMMAND PARAMETER TABLE FOR PRE-SILICON DEVICE TESTING

(71) Applicant: International Business Machines Corporation, Armonk, NY (US)

(72) Inventors: Dean G. Bair, Bloomington, NY (US); Rebecca M. Gott, Poughkeepsie, NY (US); Edward J. Kaminski, Jr., Wynnewood, PA (US); William J. Lewis, Poughkeepsie, NY (US); Chakrapani Rayadurgam, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/349,418

(22) Filed: Nov. 11, 2016

(65) Prior Publication Data

US 2017/0060716 A1 Mar. 2, 2017

Related U.S. Application Data

(63) Continuation of application No. 15/073,221, filed on Mar. 17, 2016, now Pat. No. 9,524,801, which is a
(Continued)

(51) Int. Cl.
*G06F 17/50* (2006.01)
*G06F 11/28* (2006.01)
(Continued)

(52) U.S. Cl.
CPC ............ *G06F 11/28* (2013.01); *G06F 11/073* (2013.01); *G06F 11/25* (2013.01); *G06F 11/263* (2013.01);
(Continued)

(58) Field of Classification Search
CPC ....................................................... G06F 17/50
(Continued)

(56) References Cited

U.S. PATENT DOCUMENTS 8,543,368 B1 9/2013 Sznajder et al.
2003/0229864 A1 12/2003 Watkins
(Continued)

OTHER PUBLICATIONS

Bair, Dean G., et al.; "Persistent Command Parameter Table for Pre-Silicon Device Testing"; U.S. Appl. No. 14/620,431; Date Filed: Feb. 12, 2015, U.S. Pat. No. 9,619,312, Apr. 11, 2017.
(Continued)

*Primary Examiner* — Thuan Do
(74) *Attorney, Agent, or Firm* — Cantor Colburn LLP

(57) ABSTRACT

Embodiments relate to pre-silicon device testing using a persistent command table. An aspect includes receiving a value for a persistent command parameter from a user. Another aspect includes determining whether the value of the persistent command parameter is greater than zero. Another aspect includes based on determining whether the value of the persistent command parameter is greater than zero, selecting a number of commands equal to the value of the persistent command parameter from a regular command table of a driver of a device under test. Another aspect includes adding the selected commands to the persistent command table of the driver. Another aspect includes performing testing of the device under test via the driver using only commands that are in the persistent command table of the driver.

1 Claim, 5 Drawing Sheets

Related U.S. Application Data continuation of application No. 14/620,431, filed on Feb. 12, 2015, now Pat. No. 9,619,312.

(51) Int. Cl.
| | | |
|---|---|---|
| *G06F 11/07* | (2006.01) | |
| *G06F 11/263* | (2006.01) | |
| *G06F 11/25* | (2006.01) | |
| *G06F 11/273* | (2006.01) | |
| *G06F 11/27* | (2006.01) | |
| *G11C 29/38* | (2006.01) | |
| *G11C 29/44* | (2006.01) | |
| *G11C 29/54* | (2006.01) | |

(52) U.S. Cl.
CPC .......... *G06F 11/2635* (2013.01); *G06F 11/27* (2013.01); *G06F 11/2733* (2013.01); *G11C 29/38* (2013.01); *G11C 29/44* (2013.01); *G11C 29/54* (2013.01)

(58) Field of Classification Search
USPC .......................................... 716/136
See application file for complete search history.

(56) References Cited

U.S. PATENT DOCUMENTS

| | | | |
|---|---|---|---|
| 2004/0044508 A1* | 3/2004 | Hoffman, Jr. | ....... G06F 17/5022 |
| | | | 703/13 |
| 2013/0036392 A1 | 2/2013 | Nadine | |
| 2014/0082580 A1 | 3/2014 | Bose et al. | |
| 2014/0181767 A1 | 6/2014 | Kohavi et al. | |

OTHER PUBLICATIONS

Bair, Dean G., et al.; "Persistent Command Parameter Table for Pre-Silicon Device Testing"; U.S. Appl. No. 15/073,221; Date Filed: Mar. 17, 2016, U.S. Pat. No. 9,524,801, Dec. 20, 2016.
List of IBM Patents or Patent Applications Treated as Related; (Appendix P), Filed Jul. 12, 2017; 2 pages.

\* cited by examiner

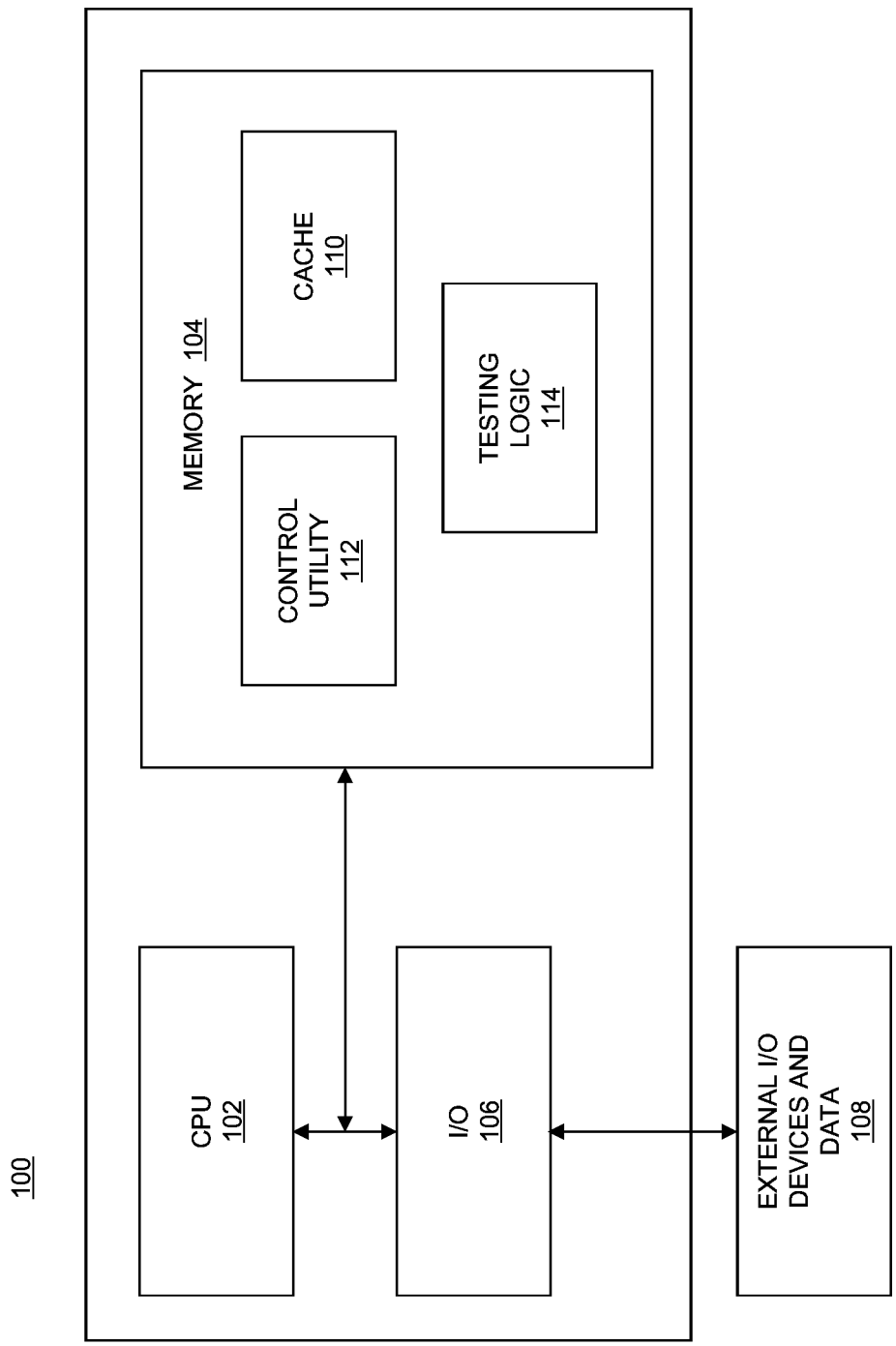

PERSISTENT COMMAND PARAMETER TABLE FOR PRE-SILICON DEVICE TESTING

PRIORITY

This application is a continuation of and claims priority from U.S. patent application Ser. No. 15/073,221, filed Mar. 17, 2016, entitled "Persistent Command Parameter Table For Pre-Silicon Device Testing" which is a continuation of U.S. patent application Ser. No. 14/620,431, filed on Feb. 12, 2015, entitled "Persistent Command Parameter Table For Pre-Silicon Device Testing", the entire contents of which are incorporated herein by reference.

BACKGROUND

The present invention relates generally to pre-silicon device testing, and more specifically, to a persistent command parameter table for pre-silicon device testing.

During the pre-silicon process, devices are tested in a virtual environment with sophisticated simulation, emulation and formal verification tools. In contrast, post-silicon validation tests occur on actual devices running at-speed in commercial, real world systems. Pre-silicon testing performs various tests to determine functional correctness and/or to assess performance of the devices under test and/or the system that includes such devices. In assessing functional correctness and performance of a device, one or more criteria may be considered, including fairness. Fairness relates, in general, to whether forward progress is being made for traffic (e.g., commands, instructions, and/or other types of traffic) being driven on interfaces of the device under test.

SUMMARY

Embodiments include a method, system, and computer program product for pre-silicon device testing using a persistent command table. An aspect includes receiving a value for a persistent command parameter from a user. Another aspect includes determining whether the value of the persistent command parameter is greater than zero. Another aspect includes based on determining whether the value of the persistent command parameter is greater than zero, selecting a number of commands equal to the value of the persistent command parameter from a regular command table of a driver of a device under test. Another aspect includes adding the selected commands to the persistent command table of the driver. Another aspect includes performing testing of the device under test via the driver using only commands that are in the persistent command table of the driver.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

FIG. 1 depicts an embodiment of a computing environment to incorporate and use one or more aspects of persistent command parameter table for pre-silicon device testing;

DETAILED DESCRIPTION

Figure 2A:
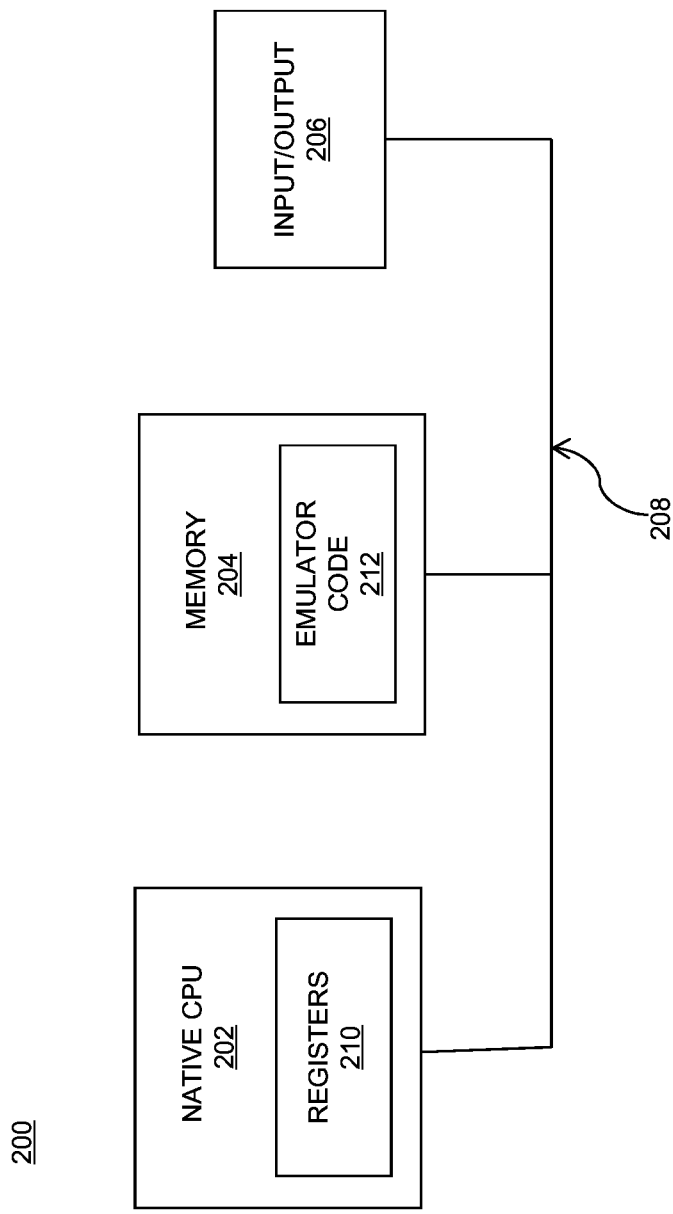
FIG. 2A depicts an embodiment of a computing environment to incorporate and use one or more aspects of persistent command parameter table for pre-silicon device testing.

Embodiments of a persistent command parameter table for pre-silicon device testing are provided, with exemplary embodiments being discussed below in detail. Certain types of device problems, such as fairness problems, and also starvation, livelock, and priority problems, may only be observable when sustained, repetitive traffic of a subset of commands from the set of all available commands of the device are driven on the interfaces of the device during testing. A random simulation driver may rely on biasing across the set of all available system commands during testing, and therefore may not drive sustained, repetitive traffic of any particular subset of commands. Manually created targeted test cases that limit the test case to include only a subset of all available commands may miss combinations of traffic that that will expose logic problems related to fairness or priority because such manually created test cases presume knowledge by the creator of the test case of what type of problems may exist. Therefore, a persistent command table comprising a random subset of the available commands of a device may be implemented during pre-silicon testing. The persistent command table comprises a random subset of all of the available commands of the device being tested. Use of the persistent command table may discover starvation, livelock, fairness, and priority problems during pre-silicon testing, saving test floor debugging time and the need fix such problems in later additional passes of silicon during manufacturing of a device.

Random simulation drivers in the test environment support the regular command driver tables, which include the full set of available commands for the interface(s) of the device under test. The persistent command table is used to persistently drive a specific subset of commands, selected from the set of all available commands, on the interfaces for the device under test. The number of commands in the persistent command table is chosen based on a persistent command parameter that is set by the user for the testing. If the persistent command parameter is set to zero, the driver chooses from the full available command table throughout the test case simulation. If the persistent command parameter is set to be greater than zero, the driver chooses a set of commands randomly from the set of available commands and adds the randomly chosen commands to the persistent command table. The number of commands selected for the persistent command table is equal to the persistent command parameter. When the persistent command table is full (i.e., the driver has selected the number of commands equal to the persistent command parameter and added them to the persistent command table), the simulation driver only issues commands from the persistent command table during execution of the test case. In a testing environment that includes multiple drivers, each driver may create a respective persistent command table in some embodiments, or a single persistent command table may be shared among a group of drivers in some embodiments. Also, the set of commands in a particular persistent command table may be driven across a subset of the drivers of the device under test, or driven across all like driver instances in the device under test.

The set of commands in the persistent command table may be driven to the device under test in a random sequence during testing in some embodiments, or, in some embodiments, may be driven repeatedly in the order in which they appear in the persistent command table. The test environment may, in some embodiments, include support a repetitive sequence parameter, which may be set by the user to true or false. When the repetitive sequence parameter is set to true, the commands from the persistent command table are driven repetitively on the interface in the order specified in the persistent command table. When the repetitive sequence parameter is set to false, the commands from the persistent command table are driven in random order on the interface.

The test environment may further support controls specifying additional aspects of interface traffic to send in a persistent manner, such as: time delay between commands; address associated with a command; cache state of a command (which is associated with the command address); and data source or target for a command (which is also associated with the command address). During the testing, the command delay between each command may be randomly chosen from the legal range of command delays and then applied persistently for a single driver instance, for a subset of driver instances, or for all driver instances in the test environment. Likewise, an attribute or attributes of the command address, such as cache hit state, data source or target, may be randomly chosen from the set of legal attributes and then applied persistently for a single driver instance, for a subset of driver instances, or for all driver instances in the test environment.

One embodiment of a computing environment to incorporate and use one or more aspects of persistent command parameter table for pre-silicon device testing is described with reference to FIG. 1. Referring to FIG. 1, in one example, a computing environment 100 is based on the Power Architecture, offered by International Business Machines (IBM®) Corporation, Armonk, N.Y., and includes, for instance, a pSeries or System p server.

IBM, POWER, SYSTEM P, and AIX, Z/ARCHITECTURE, POWER ARCHITECTURE and POWERPC (referenced below) are registered trademarks of International Business Machines Corporation, Armonk, N.Y. Other names used herein may be registered trademarks, trademarks or product names of International Business Machines Corporation or other companies.

As one example, computing environment 100 includes a processor (e.g., a central processing unit—CPU) 102 communicatively coupled to memory 104 and an input/output (I/O) subsystem 106. I/O subsystem 106 is further communicatively coupled to external I/O devices 108 that may include, for example, data input devices, sensors and/or output devices, such as displays.

Memory 104 includes, for instance, one or more caches 110, at least one control utility 112, such as an operating system (e.g., AIX, offered by International Business Machines Corporation, Armonk, N.Y.), and one or more aspects of a testing logic 114 to be executed by the processor to test devices under test.

Another embodiment of a computing environment to incorporate and use one or more aspects of persistent command parameter table for pre-silicon device testing is described with reference to FIG. 2A. In this example, a computing environment 200 includes, for instance, a native central processing unit (CPU) 202, a memory 204, and one or more input/output devices and/or interfaces 206 coupled to one another via, for example, one or more buses 208 and/or other connections. As examples, computing environment 200 may include a PowerPC processor or a Power Systems server offered by International Business Machines Corporation, Armonk, N.Y.; an HP Superdome with Intel Itanium II processors offered by Hewlett Packard Co., Palo Alto, Calif.; and/or other machines based on architectures offered by International Business Machines Corporation, Hewlett Packard, Intel, Oracle, or others.

Native central processing unit 202 includes one or more native registers 210, such as one or more general purpose registers and/or one or more special purpose registers used during processing within the environment that include information that represents the state of the environment at any particular point in time.

Moreover, native central processing unit 202 executes instructions and code that are stored in memory 204. In one particular example, the central processing unit executes emulator code 212 stored in memory 204. This code enables the computing environment configured in one architecture to emulate one or more other architectures. For instance, emulator code 212 allows machines based on architectures other than the z/Architecture, such as PowerPC processors, Power Systems servers, HP Superdome servers or others, to emulate the z/Architecture and to execute software and instructions developed based on the z/Architecture, or allows machines based on architectures other than the Power Architecture, such as HP Superdome Servers or others, to emulate the Power Architecture and to execute software and instructions developed based on the Power Architecture.

Figure 2B:
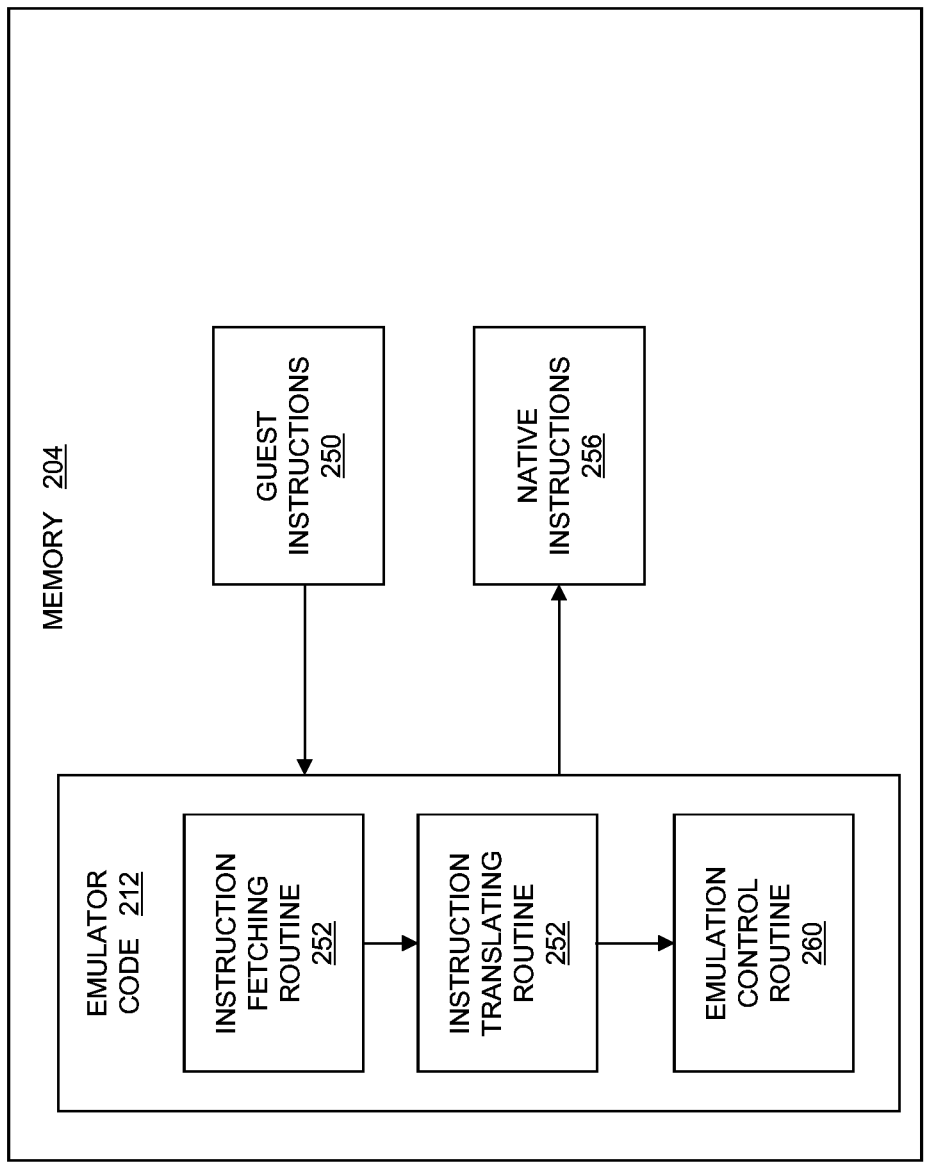
FIG. 2B depicts further details of the memory of FIG. 2A.

Further details relating to emulator code 212 are described with reference to FIG. 2B. Guest instructions 250 stored in memory 204 comprise software instructions (e.g., correlating to machine instructions) that were developed to be executed in an architecture other than that of native CPU 202. For example, guest instructions 250 may have been designed to execute on a Power Architecture (or z/Architecture) processor 102, but instead, are being emulated on native CPU 202, which may be, for example, an Intel Itanium II processor. In one example, emulator code 212 includes an instruction fetching routine 252 to obtain one or more guest instructions 250 from memory 204, and to optionally provide local buffering for the instructions obtained. It also includes an instruction translation routine 254 to determine the type of guest instruction that has been obtained and to translate the guest instruction into one or more corresponding native instructions 256. This translation includes, for instance, identifying the function to be performed by the guest instruction and choosing the native instruction(s) to perform that function.

Further, emulator code 212 includes an emulation control routine 260 to cause the native instructions to be executed. Emulation control routine 260 may cause native CPU 202 to execute a routine of native instructions that emulate one or more previously obtained guest instructions and, at the conclusion of such execution, return control to the instruction fetch routine to emulate the obtaining of the next guest instruction or a group of guest instructions. Execution of the native instructions 256 may include loading data into a register from memory 204; storing data back to memory from a register; or performing some type of arithmetic or logic operation, as determined by the translation routine. In one example, the guest instructions that are fetched and translated into native instructions may be instructions of the persistent command parameter table for pre-silicon device testing used to test the devices under test.

Each routine is, for instance, implemented in software, which is stored in memory and executed by native central processing unit 202. In other examples, one or more of the routines or operations are implemented in firmware, hardware, software or some combination thereof. The registers of the emulated processor may be emulated using registers 210 of the native CPU or by using locations in memory 204. In embodiments, guest instructions 250, native instructions 256 and emulator code 212 may reside in the same memory or may be disbursed among different memory devices.

As used herein, firmware includes, e.g., the microcode, millicode and/or macrocode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

The computing environments described above are only examples of computing environments that can be used. Other environments, including but not limited to, other non-partitioned environments, partitioned environments, and/or other emulated environments, may be used; embodiments are not limited to any one environment or to any particular architecture or system.

Testing logic executed by one or more processors of a computing environment is used to test a device under test. In particular, in this example, the testing logic 114 is used to evaluate characteristics such as fairness, priority, livelock, and/or starvation for the device under test using a persistent command table. The device under test may be of many designs, but in the example described herein, it is a cache, such as an L3 cache, design. However, this is only one example of a design that may be tested pre-silicon.

Figure 3:
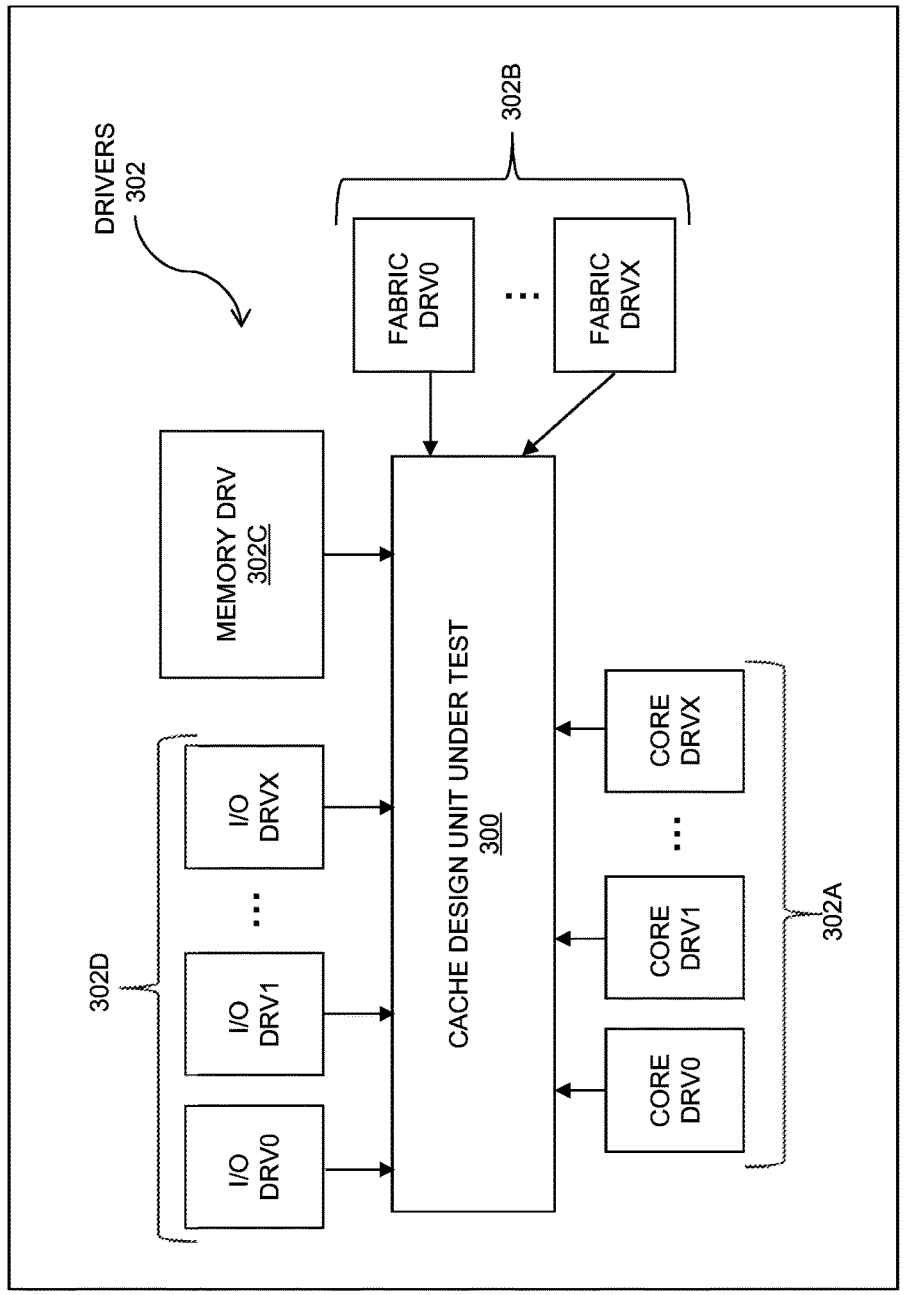
FIG. 3 depicts an example of a device under test with a plurality of drivers driving traffic on interfaces of the device under test.

Referring to FIG. 3, in one embodiment, traffic (e.g., commands, instructions, etc.) is driven on interfaces of a device under test 300, such as a cache design, by a plurality of drivers 302. The traffic may be generated using a persistent command table. As used herein, a driver is any entity used to drive traffic on the device under test. In one embodiment, the driver drives traffic on the interfaces of the device under test, and therefore, may be referred to as an interface driver. A particular example of a driver is a bus functional model, which may be defined as tasks in, for instance, hardware description languages. The drivers may be of different types. For instance, in this example, the drivers include processing cores 302A, fabric drivers 302B, memory drivers 302C, and input/output (I/O) drivers 302D, each of which executes on a processor and drives traffic on the device under test, as appropriate for the type of driver. Each driver type 302A-D has a respective set of available commands, and a persistent command table is generated for a particular driver of drivers 302 by selecting commands from the set of available commands for the type of the particular driver. FIG. 3 is shown for illustrative purposes only; any appropriate type of device may be tested using embodiments of pre-silicon device testing using a persistent command table.

Figure 4:
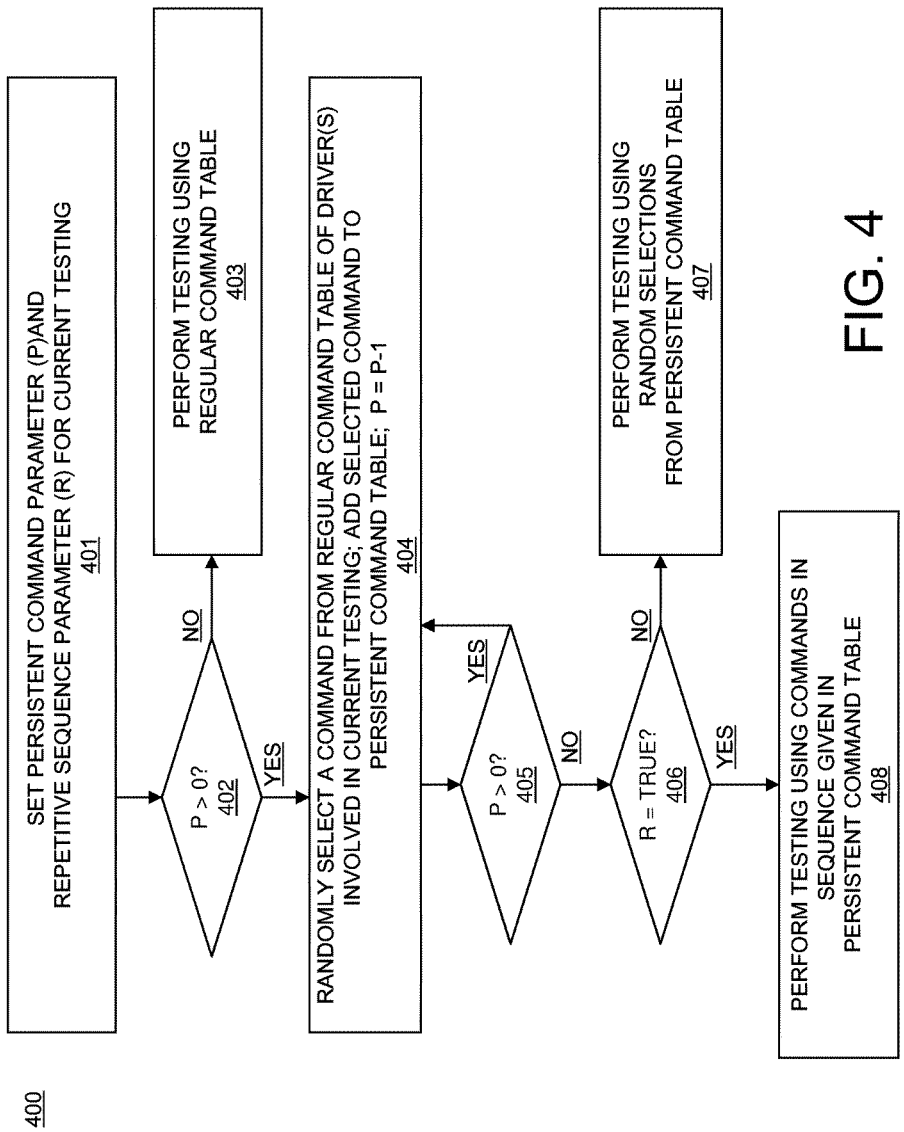
FIG. 4 depicts a process flow for a persistent command parameter table for pre-silicon device testing in accordance with an embodiment.

FIG. 4 illustrates an embodiment of a method 400 for pre-silicon device testing using a persistent command table. Method 400 may be implemented in a testing logic 114 of a computing environment 100 as shown in FIG. 1, and applied to a device under test 300 such as is shown in FIG. 3 via one or more of drivers 302. First, in block 401, a user, who may be, for example, a test engineer, sets a persistent command parameter and a repetitive sequence parameter for testing of the device under test 300. The persistent command parameter and repetitive sequence parameter may be specified for testing of the device under test 300 via a single driver of drivers 302, or may be applied to multiple drivers of the same type (for example, all of I/O drivers 302D). Next, in block 402, testing commences, and it is determined by the test environment whether the persistent command parameter is greater than zero. If it is determined in block 402 that the persistent command parameter is not greater than zero, flow proceeds to block 403, and the testing proceeds using the entire set of available commands in the regular command table of the one or more drivers of the device under test 300 that are involved in the current testing. If it is determined in block 402 that the persistent command parameter is greater than zero, flow proceeds to block 404. In block 404, a command is randomly selected from the regular command table of the one or more drivers involved in the current testing, and added to the persistent command table, and the persistent command parameter is decremented. The persistent command table is specific to the one or more drivers (which are of the same type) involved in the current testing, and the randomly selected command is selected from the set of all available commands of the one or more drivers involved in the current testing. Then, in block 405, it is determined whether the persistent command parameter is greater than zero. If it is determined in block 405 that the persistent command parameter is greater than zero, flow returns from block 405 back to block 404, and another command is selected from the regular command table and added to the persistent command table. Blocks 404 and 405 are repeated until the number of commands that have been added to the persistent command table is equal to the value that was set in the persistent command parameter by the user in block 401.

When, in block 404, it is determined that the persistent command parameter is not greater than zero, flow proceeds to block 406. In block 406, it is determined whether the repetitive sequence parameter that was set in block 401 is true. If it is determined in block 406 that the repetitive sequence parameter is not true, flow proceeds from block 406 to block 407, and the testing of the device under test 300 is run via the one or more drivers using random selections from the persistent command table. The commands from the persistent command table may be driven randomly during the testing of block 407 any appropriate number of times. If it is determined in block 406 that the repetitive sequence parameter is true is block 406, flow proceeds to block 408, and the testing of the device under test 300 is run via the one or more drivers with the commands from the persistent command table being driven repeatedly in the order in which they appear in the persistent command table. The commands from the persistent command table may be driven in order during the testing of block 408 any appropriate number of times. Method 400 may be repeated any number of times in order to thoroughly test the device under test 300. In subsequent iterations of method 400, the persistent command parameter and repetitive sequence parameter may change, or may stay the same. In subsequent iterations of method 400, a different set of commands is randomly selected from the regular command table in blocks 404-405 to form a new persistent command table for use in block 407 or 408.

During block 401, the user may further specify additional aspects of the testing traffic for the current testing to drive in a persistent manner, such as: time delay between commands;

address associated with a command; cache state of a command (which is associated with the command address); and data source or target for a command (which is also associated with the command address). These aspects are then applied during the testing in blocks 403, 407, or 408. During the testing, the command delay between each command may be randomly chosen from the legal range of command delays and then applied persistently for a single driver instance, for a subset of driver instances, or for all driver instances in the test environment. Likewise, the test command traffic may be persistently driven for attributes associated with the address of the command, such as cache hit state, data source, or target.

Technical effects and benefits include determination of fairness, livelock, priority, and/or starvation problems in a device under test.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer program product for pre-silicon device testing using a persistent command table, the computer program product comprising:

a non-transitory computer readable storage medium having program instructions embodied therewith, the program instructions readable by a processor to cause the processor to perform a method comprising:

executing, by the processor, testing logic for a pre-silicon device of a cache design in a virtual environment;

obtaining, by the processor, a persistent command parameter and a repetitive sequence parameter having been specified for testing of a device under test, the testing of the device under test being via a single driver or multiple drivers of a same type;

wherein the device under test is the pre-silicon device in the virtual environment, wherein a regular command table is defined as comprising a full set of available commands configured to test the pre-silicon device, wherein the persistent command table comprises a random subset of the available commands configured to test the pre-silicon device, wherein a persistent command parameter defines a number of the available commands to be in the persistent command table, wherein a repetitive sequence parameter defines whether the available commands in the persistent command table are to test the pre-silicon device in a repetitive manner or in a random order, wherein the available commands in the persistent command table are instructions to test the pre-silicon device;

commencing the testing which comprises:
   (i) determining, by the processor, whether the persistent command parameter is greater than zero;
   (ii) in response to determining that the persistent command parameter is not greater than zero, proceeding with the testing using a full set of the available commands in the regular command table;
   (iii) in response to determining that the persistent command parameter is greater than zero, randomly selecting a command from the regular command table, adding the command to the persistent command table, and decrementing the persistent command parameter;
   (iv) determining whether the persistent command parameter is greater than zero after decrementing the persistent command parameter;
   (v) in response to determining that the persistent command parameter is greater than zero after decrementing the persistent command parameter, repeating (iii) and (iv) until a number of commands in the persistent command table is equal to an original value that was set in the persistent command parameter;
   (vi) in response to determining that the persistent command parameter is not greater than zero after decrementing the persistent command parameter, determining whether the repetitive sequence parameter is true;
   (vii) in response to determining that the repetitive sequence parameter is not true, performing the testing of the device under test with the single driver or the multiple drivers of the same type using random selections from the persistent command table; and
   (viii) in response to determining that the repetitive sequence parameter is true, performing the testing of the device under test with the single driver or the multiple drivers of the same type driving commands repeatedly in an order of appearance in the persistent command table.

* * * * *